(12) United States Patent
Liu et al.

(10) Patent No.: US 10,804,461 B1
(45) Date of Patent: Oct. 13, 2020

(54) MANUFACTURING METHOD OF MEMORY DEVICE

(71) Applicant: UNITED MICROELECTRONICS CORP., Hsin-Chu (TW)

(72) Inventors: Hsin-Jung Liu, Pingtung County (TW); Kun-Ju Li, Tainan (TW); Ang Chan, Taipei (TW); Chau-Chung Hou, Tainan (TW); Yu-Lung Shih, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/517,693

(22) Filed: Jul. 22, 2019

(30) Foreign Application Priority Data

Jun. 27, 2019 (CN) .......................... 2019 1 0565683

(51) Int. Cl.
*H01L 21/00* (2006.01)
*H01L 43/12* (2006.01)
*H01L 43/02* (2006.01)

(52) U.S. Cl.
CPC .............. *H01L 43/12* (2013.01); *H01L 43/02* (2013.01)

(58) Field of Classification Search
CPC ................................. H01L 43/12; H01L 43/02
USPC ............................................................. 483/3
See application file for complete search history.

(56) References Cited

U.S. PATENT DOCUMENTS

| 6,528,432 | B1 | 3/2003 | Ngo | |
| 6,780,775 | B2 * | 8/2004 | Ning | G03F 9/7076 |
| | | | | 257/E21.606 |
| 7,442,624 | B2 * | 10/2008 | Sarma | H01L 23/544 |
| | | | | 257/E23.179 |
| 9,633,861 | B2 * | 4/2017 | Ye | H01L 21/76883 |
| 2003/0032292 | A1 * | 2/2003 | Noguchi | H01L 21/76801 |
| | | | | 438/692 |
| 2006/0148255 | A1 | 7/2006 | Lu | |

OTHER PUBLICATIONS

Kim, Title:Post Cleaning Chemical of Tungsten Chemical Mechanical Planarization for Memory Devices, Feb. 14, 2019.

* cited by examiner

Primary Examiner — Vu A Vu
(74) Attorney, Agent, or Firm — Winston Hsu

(57) ABSTRACT

A method for manufacturing a memory device is provided, the method includes the following steps: firstly, providing a dielectric layer, then simultaneously forming a contact window and an alignment mark trench in the dielectric layer, wherein the contact window exposes a lower metal line, then forming a conductive layer on the surface of the dielectric layer, in the contact window and in the alignment mark trench, performing a planarization step on the conductive layer, and leaving a residue in the alignment mark trench. Subsequently, a nitrogen plasma step ($N_2$ plasma) is performed on the dielectric layer, a cleaning step is performed to remove the residue in the alignment mark trench, and a patterned magnetic tunneling junction, MTJ) film is laminated on the contact window.

12 Claims, 6 Drawing Sheets

MANUFACTURING METHOD OF MEMORY DEVICE

BACKGROUND OF THE INVENTION

1. Field of the Invention

The present invention relates to a method for forming memory device, and more particularly, to a method for forming a memory device including an alignment mark trench.

2. Description of the Prior Art

The manufacture of integrated circuits keeps improving as the related technologies progress. Many kinds of electric circuits may be integrated and formed on a single chip. The semiconductor processes for forming integrated circuits including semiconductor devices and/or memory devices may include many steps, such as a deposition process for forming a thin film, a photoresist coating process, an exposure process, and a develop process for forming a patterned photoresist, and an etching process for patterning the thin film. In the exposure process, a photomask having a pattern to be formed has to be aligned with a base layer pattern on a substrate for transferring the pattern to a specific location on the substrate. The alignment marks may be used to assist the alignment in the exposure process and to monitor overlay results for reducing the influence of process variations on the production yield. However, as the semiconductor process becomes more complicated, problems about manufacturing and measurements of alignment marks are generated accordingly and have to be solved.

SUMMARY OF THE INVENTION

The present invention provides a method for manufacturing a memory device, the method includes the following steps: firstly, providing a dielectric layer, then simultaneously forming a contact window and an alignment mark trench in the dielectric layer, wherein the contact window exposes a lower metal line, then forming a conductive layer on the surface of the dielectric layer, in the contact window and in the alignment mark trench, performing a planarization step on the conductive layer, and leaving a residue in the alignment mark trench. Subsequently, a nitrogen plasma step ($N_2$ plasma) is performed on the dielectric layer, a cleaning step is performed to remove the residue in the alignment mark trench, and a patterned magnetic tunneling junction, MTJ) film is laminated on the contact window.

One of the features of the present invention is that after the planarization step, some residues will be left in the alignment mark trench, which will affect the subsequent alignment step. Therefore, the present invention uses a nitrogen plasma step to form a nitrogen-containing doped region on the surface of the dielectric layer, and then uses diluted hydrofluoric acid to clean the residues while avoiding damaging the surface of the dielectric layer. According to the method provided by the invention, residues in the alignment mark trenches can be removed completely, the accuracy of subsequent alignment steps is improved, and the yield of memory elements is further improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic drawings illustrating a manufacturing method of a memory device according to a first embodiment of the present invention, wherein:

FIG. 2 is a schematic drawing in a step subsequent to FIG. 1;

FIG. 3 is a schematic drawing in a step subsequent to FIG. 2;

FIG. 4 is a schematic drawing in a step subsequent to FIG. 3;

FIG. 5 is a schematic drawing in a step subsequent to FIG. 4;

FIG. 6 is a schematic drawing in a step subsequent to FIG. 5;

FIG. 7 is a schematic drawing in a step subsequent to FIG. 6;

FIG. 8 is a schematic drawing in a step subsequent to FIG. 7;

FIG. 9 is a schematic drawing in a step subsequent to FIG. 8;

FIG. 10 is a schematic drawing in a step subsequent to FIG. 9; and

FIG. 11 is a schematic drawing in a step subsequent to FIG. 10.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
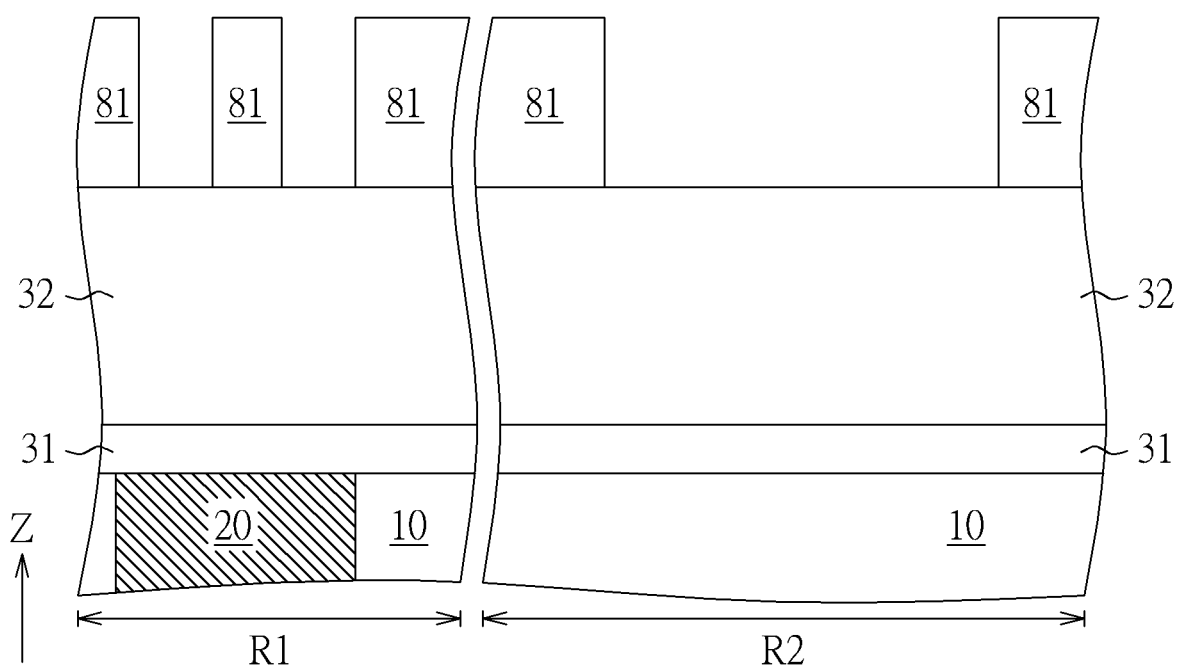
Figure 2:
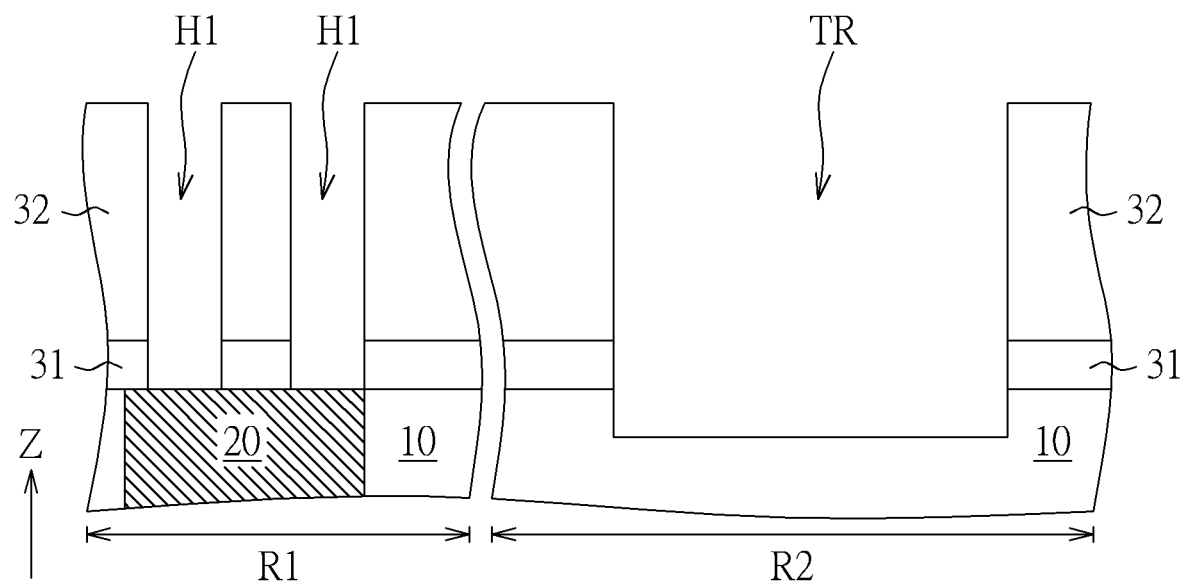
Figure 3:
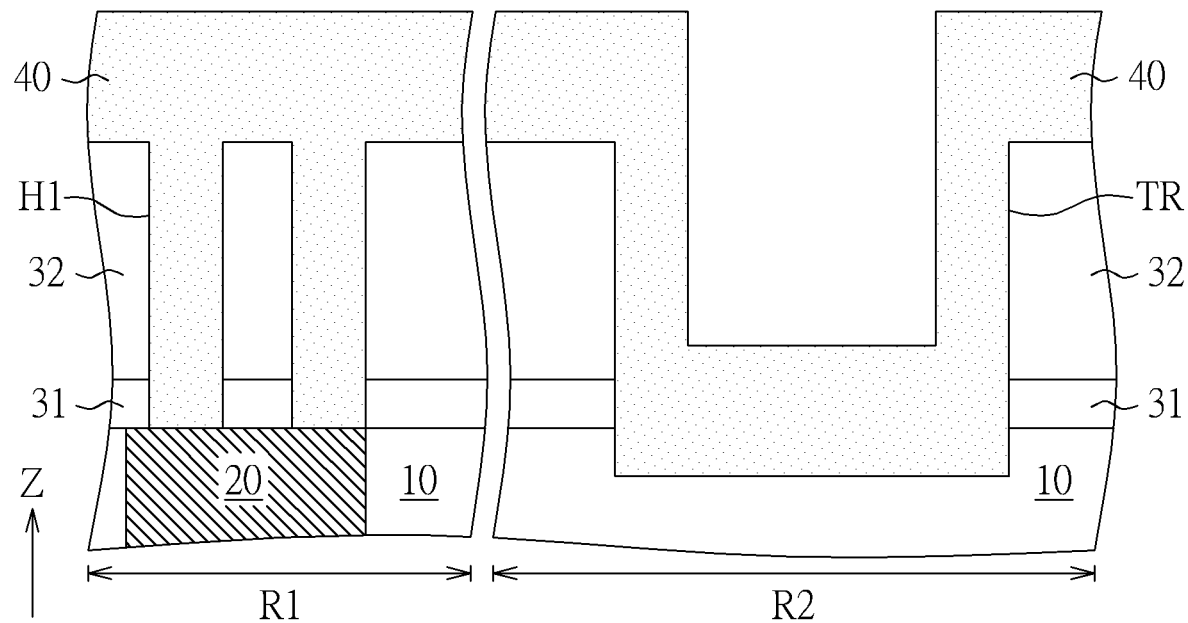
Figure 4:
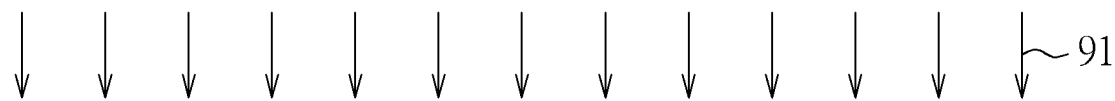
Figure 4:
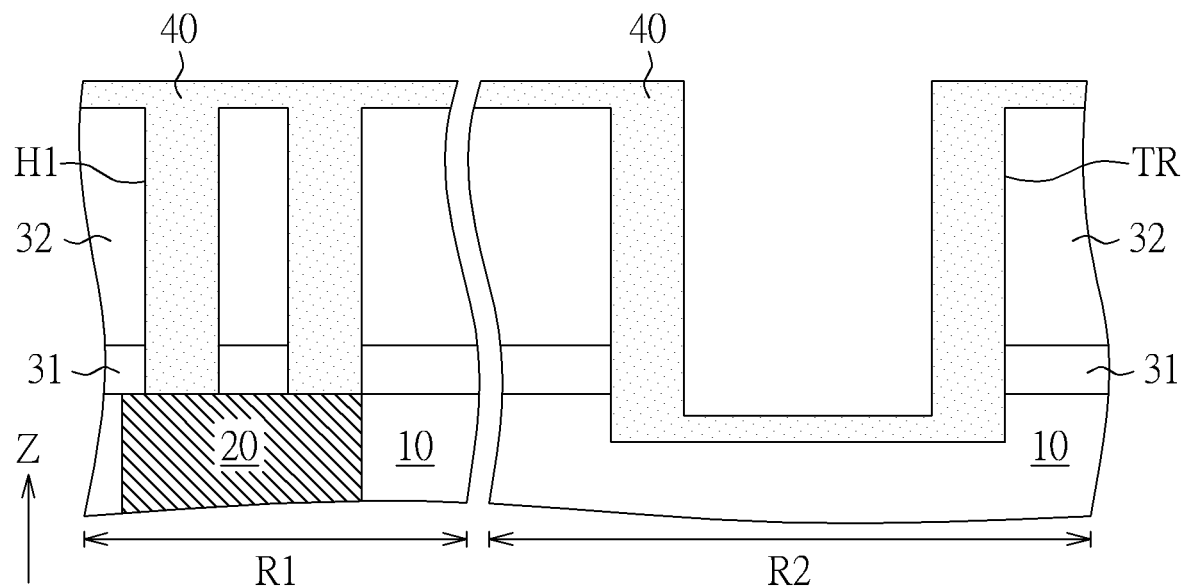
Figure 5:
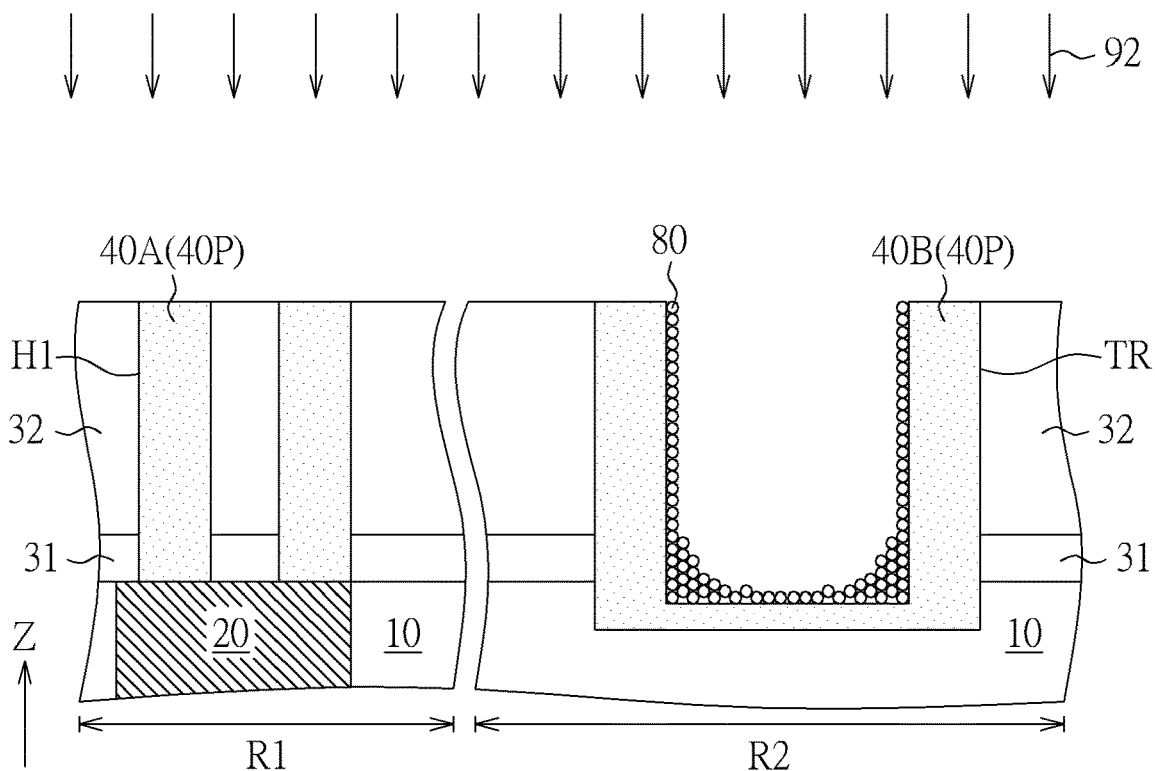
Figure 6:
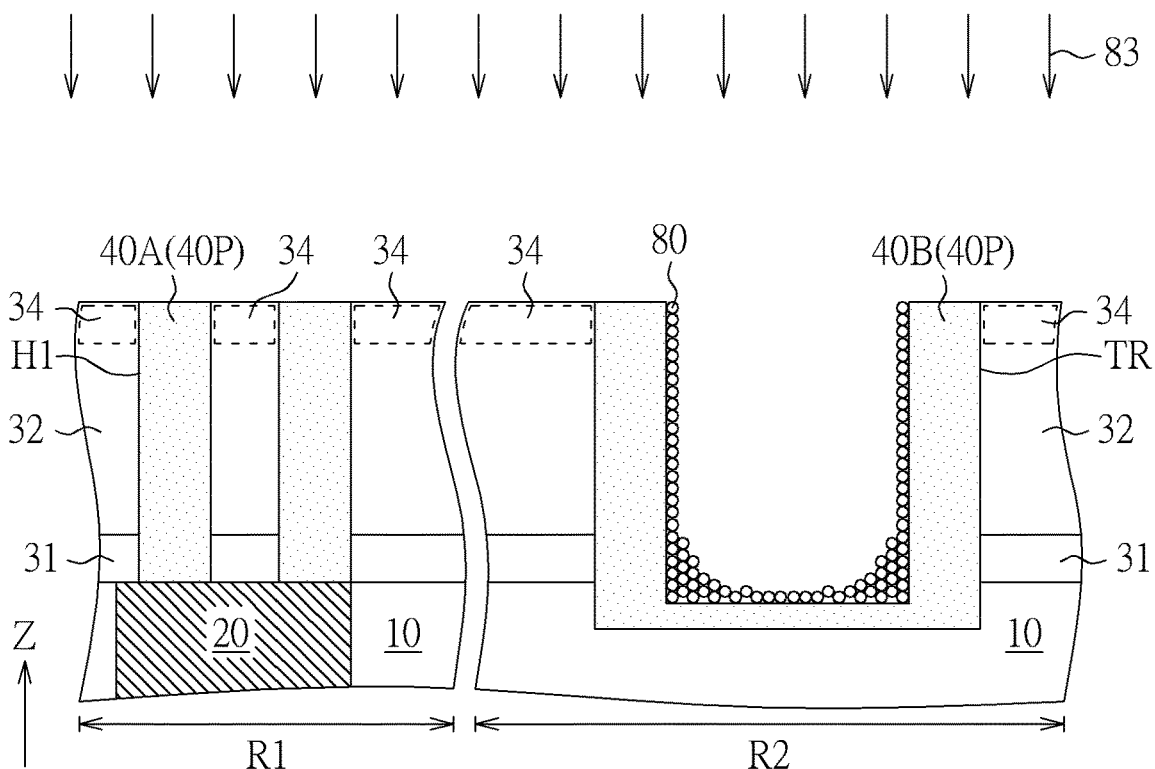
Figure 7:
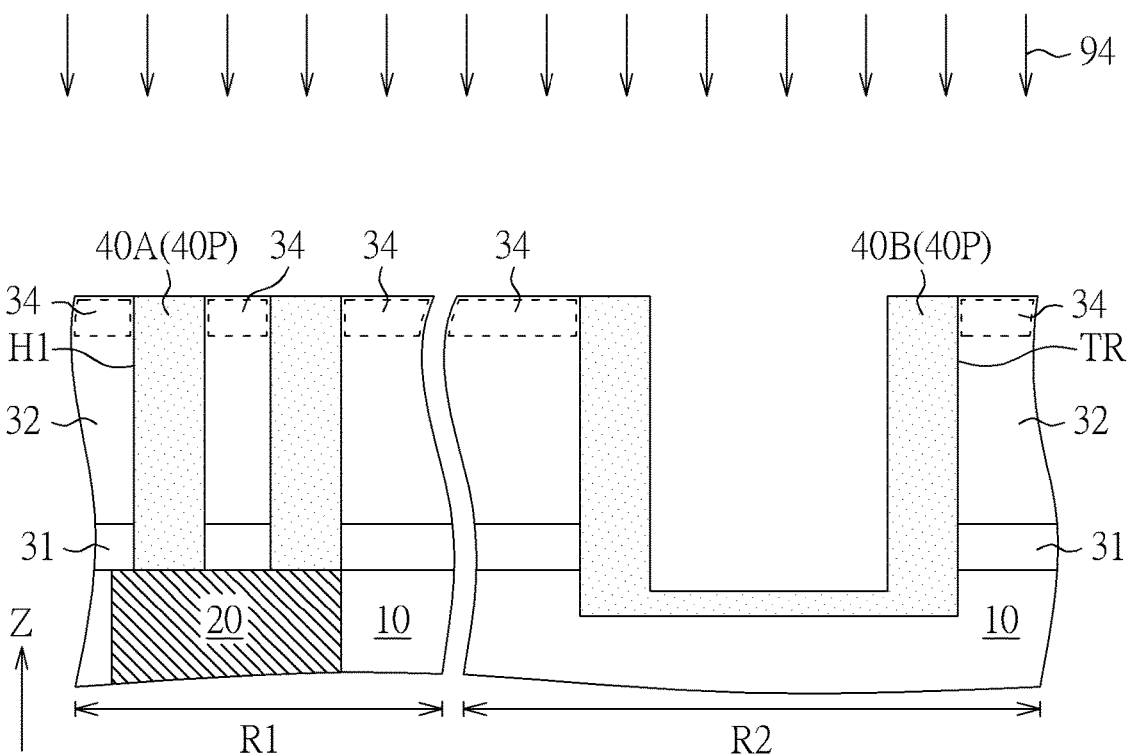
Figure 8:
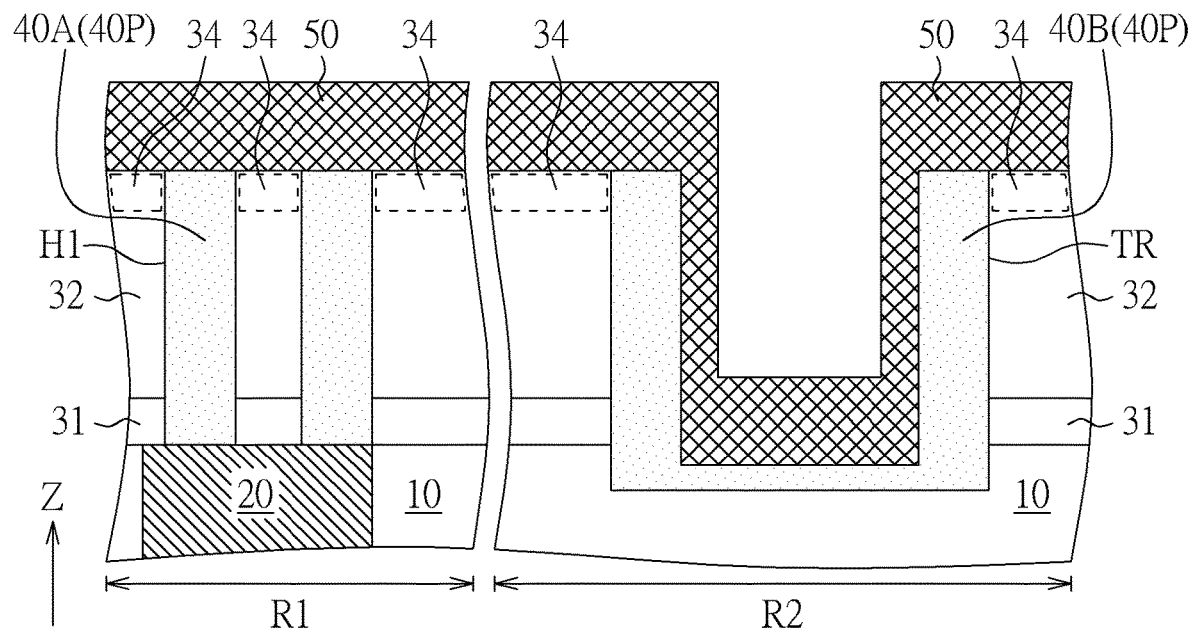
Figure 9:
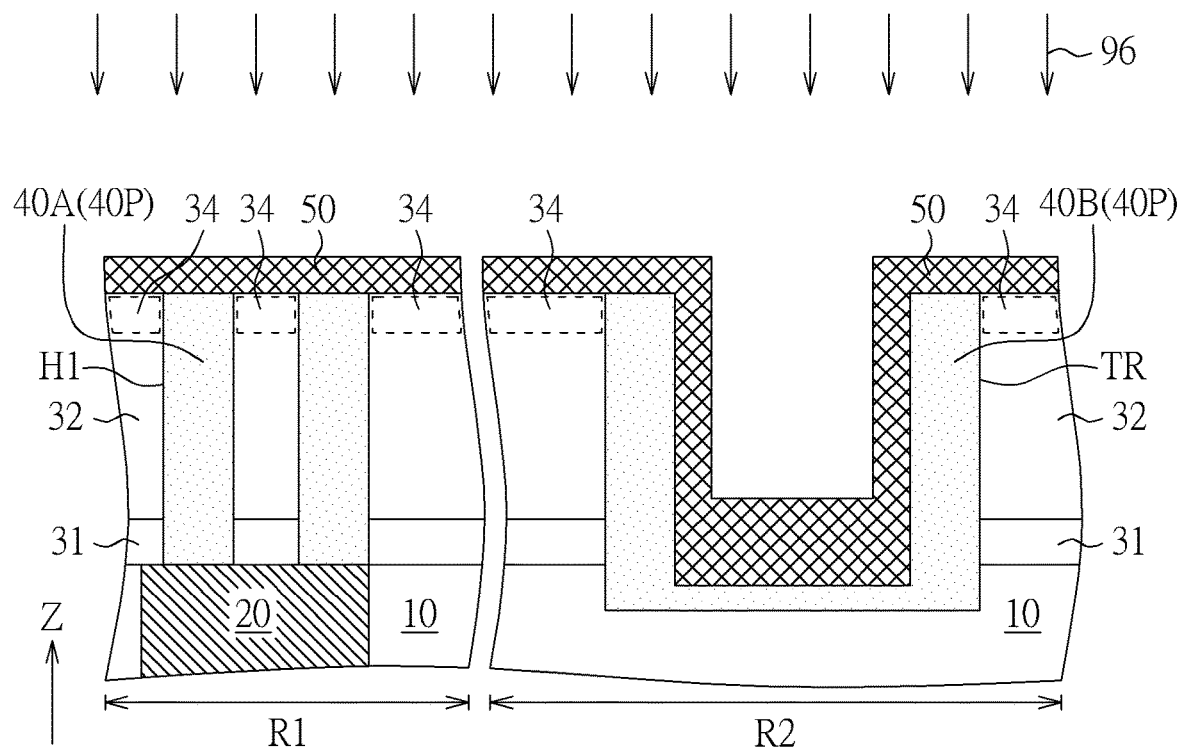
Figure 10:
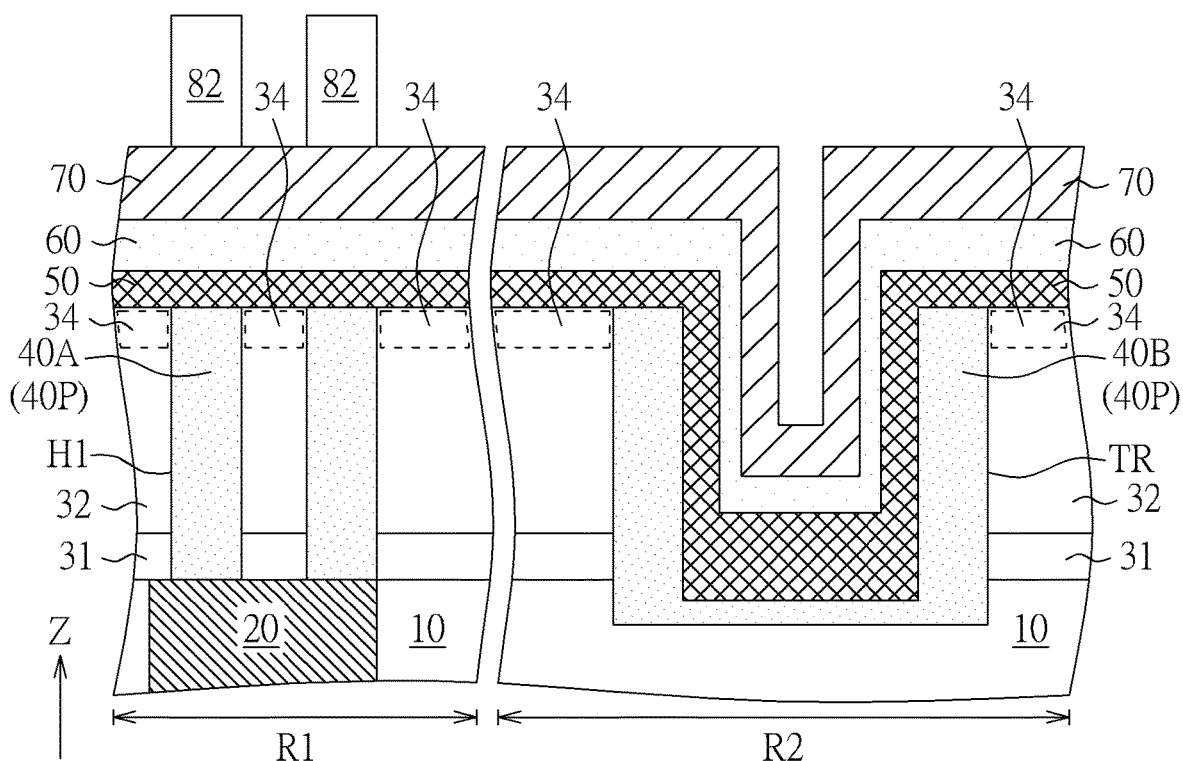
Figure 11:
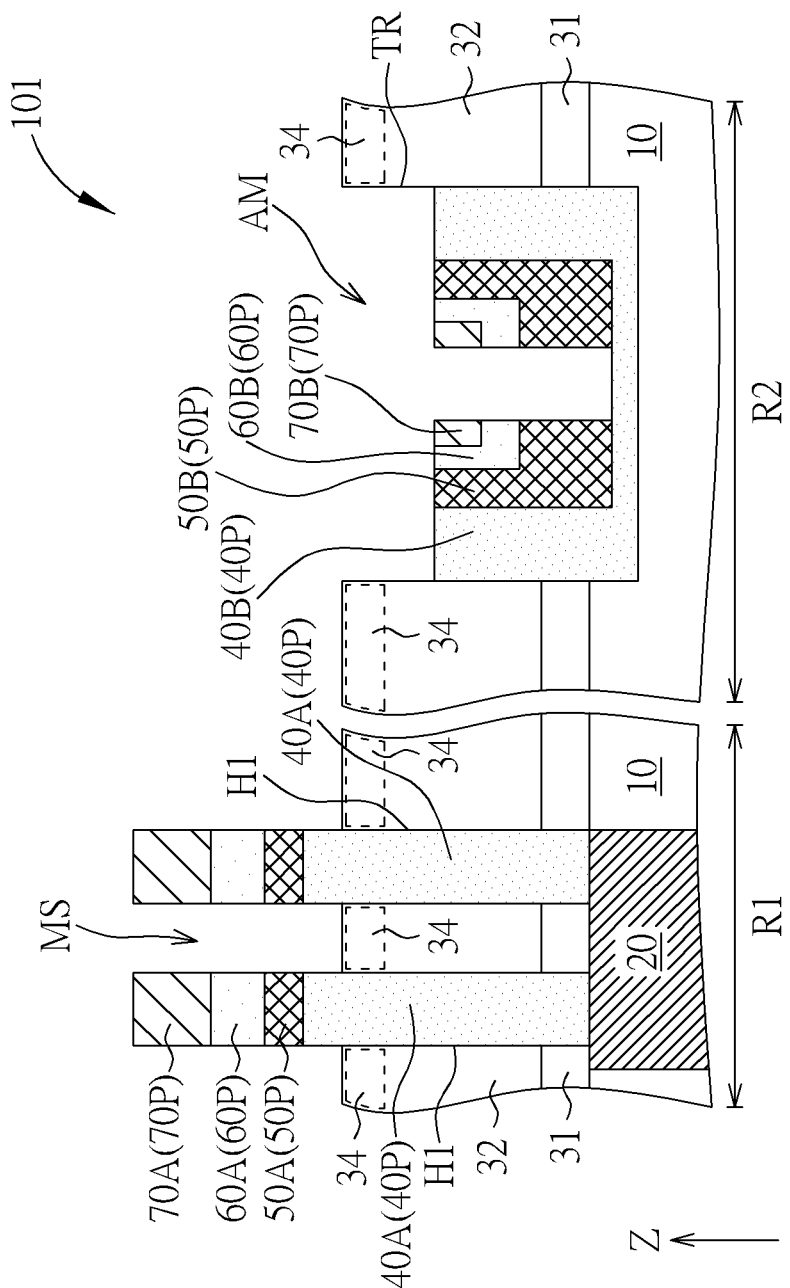

Please refer to FIGS. 1-11. FIGS. 1-11 are schematic drawings illustrating a manufacturing method of a memory device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10. The manufacturing method of a memory device in this embodiment may include the following steps. As shown in FIG. 1, an insulation layer 10 is provided, and an interconnection structure 20 is formed in the insulation layer 10. In some embodiments, a memory cell region R1 and a peripheral region R2 may be defined on the insulation layer 10. The interconnection structure 20 may be disposed in the memory cell region R1, and the peripheral region R2 may include an alignment mark region, but not limited thereto. In some embodiments, the insulation layer 10 may be disposed on a substrate (not shown), but not limited thereto. The substrate mentioned above may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. In addition, other devices, such as transistors, may be formed on the substrate before the steps of forming the insulation layer 10 and the interconnection structure 20 according to some considerations, and a memory structure subsequently formed on the interconnection structure 20 may be electrically connected to other devices (such as the transistors mentioned above) via the interconnection structure 20 and/or other connection structures, but not limited thereto.

As shown in FIG. 1, one or more dielectric layers may be formed covering the insulation layer 10 and the interconnection structure 20. For example, a first dielectric layer 31 and a second dielectric layer 32 may be sequentially formed covering the insulation layer 10 and the interconnection structure 20 in a thickness direction Z of the insulation layer 10, but not limited thereto. In some embodiments, the insulation layer 10, the first dielectric layer 31, and the second dielectric layer 32 may respectively include dielectric materials such as silicon oxide, silicon nitride, silicon oxynitride, tetraethoxysilane (TEOS), nitrogen doped carbide (NDC), or other suitable dielectric materials, and the material composition of the first dielectric layer 31 may be different from the material composition of the second dielectric layer 32 for etching selectivity concerns in the subsequent processes, but not limited thereto. In this embodiment, the first dielectric layer 31 is nitrogen-doped carbide (NDC) and the second dielectric layer 32 is tetraethoxysilane (TEOS), but is not limited thereto. The interconnection structure 20 may include a conductive material and/or a barrier material. The barrier material mentioned above may include titanium (Ti), titanium nitride (TiN), tantalum (Ta), tantalum nitride (TaN), tungsten silicide (WSi), tungsten nitride (WN), or other suitable barrier materials. The conductive material mentioned above may include aluminum (Al), tungsten (W), copper (Cu), titanium aluminide (TiAl), or other suitable low resistivity materials.

As shown in FIG. 1 and FIG. 2, a connection window H1 may be formed penetrating the first dielectric layer 31 and the second dielectric layer 32 on the interconnection structure 20 for exposing a part of the interconnection structure 20, and an alignment mark trench TR may be formed penetrating the first dielectric layer 31 and the second dielectric layer 32 on peripheral region R2 for exposing a part of the insulation layer 10. In some embodiments, the connection window H1 and the alignment mark trench TR may be formed concurrently by the same process, and the width of the alignment mark trench TR may be larger than the width and/or the diameter of the connection window H1. For example, in some embodiments, the width of the alignment mark trench TR is about 1 μm, but is not limited thereto. A first patterned photoresist layer 81 may be formed on the second dielectric layer 32, and an etching process using the first patterned photoresist layer 81 as a mask may be performed to form the connection window H1 on the memory cell region R1 and the alignment mark trench TR on the peripheral region R2. In some embodiments, a bottom surface of the alignment mark trench TR (such as the bottommost surface of the alignment mark trench TR) may be lower than a bottom surface of the connection window H1 (such as the bottommost surface of the connection window H1) and a top surface of the interconnection structure 20 in the thickness direction Z of the insulation layer 10 because the etching rate of the interconnection structure 20 may be lower than the etching rate of the insulation layer 10 in the etching process of forming the connection window H1 and the alignment mark trench TR, but not limited thereto. Therefore, in some embodiments, the alignment mark trench TR may be partly disposed in the insulation layer 10, but not limited thereto. Additionally, the patterned photoresist layer 81 may be formed by the identical photomask preferably, and the alignment mark trench TR may be used to represent the relative position of the connection window H1 accordingly, but not limited thereto.

As shown in FIGS. 3-5, a first patterned conductive layer 40P is then formed on the insulation layer 10. The first patterned conductive layer 40P may include a connection structure 40A and a first pattern 40B separated from each other. The connection structure 40A is formed in the connection window H1, and the first pattern 40B is formed in the alignment mark trench TR. Specifically, the method of forming the first patterned conductive layer 40P may include but is not limited to the following steps. As shown in FIG. 3, a first conductive layer 40 may be formed after the step of forming the connection window H1 and the alignment mark trench TR. The first conductive layer 40 may be formed on the insulation layer 10, the first dielectric layer 31, the second dielectric layer 32, and the interconnection structure 20. In some embodiment, the connection window H1 may be fully filled with the first conductive layer 40, and the alignment mark trench TR may not be fully filled with the first conductive layer 40 by controlling the deposition thickness of the first conductive layer 40 because the width of the alignment mark trench TR is larger than the width and/or the diameter of the connection window H1. The first conductive layer 40 may be a single layer structure or a multiple layer structure including a barrier material and a low resistivity material disposed above the barrier material. The barrier material mentioned above may include titanium, titanium nitride, tantalum, tantalum nitride, tungsten silicide, tungsten nitride, or other suitable barrier materials. The low resistivity material mentioned above may include aluminum, tungsten, copper, titanium aluminide, or other suitable low resistivity materials. As shown in FIG. 3 and FIG. 5, a removing process 92 may be performed to remove the first conductive layer 40 outside the connection window H1 and the alignment mark trench TR for forming the first patterned conductive layer 40P including the connection structure 40A and the first pattern 40B. Therefore, the connection structure 40A is separated from the first pattern 40B, the connection structure 40A is not directly connected with the first pattern 40B, and the material composition of the connection structure 40A may be identical to the material composition of the first pattern 40B, but not limited thereto. The removing process 92 may include a chemical mechanical polishing (CMP) process or other suitable removing approaches. As shown in FIG. 4 and FIG. 5, in some embodiments, an etching back process 91 may be performed to the first conductive layer 40 before the removing process 92 for reducing the center thickness of the first conductive layer 40 in the alignment mark trench TR, increasing the height difference of an alignment mark subsequently formed on the alignment mark trench TR, and/or lowering the surface roughness of the first conductive layer 40, but not limited thereto. The insulation layer 10 under the alignment mark trench TR may be still covered by the first conductive layer 40 and is not exposed after the etching back process 91 because the etching back process 91 has to be controlled for avoiding damaging the first conductive layer 40 in the connection window H1. Therefore, in some embodiments, the top surface of the center part of the first pattern 40B may be lower than the bottommost surface of the connection structure 40A in the thickness direction Z of the insulation layer 10, but not limited thereto.

It is worth noting that the applicant found that after the planarization step 92 (e.g., chemical mechanical polishing as shown in FIG. 5) is performed, a portion of residue 80 may be left in the alignment mark trench TR. After observation by the applicant, it is found that since the planarization step 92 is accompanied by the use of slurry, the abrasive in the slurry may remain in the alignment mark trench TR to form the residue 80, that is, the residue 80 mainly contains the abrasive in the slurry, and the material is, for example, silicon oxide, etc., but is not limited thereto. If the residue 80 is left in the alignment mark trench TR without being removed, subsequent alignment steps may be affected, thus affecting the yield of the memory device. However, if the residue 80 is removed by etching (e.g., the semiconductor device is immersed in a diluted hydrofluoric acid (DHF) solution), it may damage other parts of the structure at the same time, especially the second dielectric layer 32 (made of oxide such as TEOS) exposed on the surface, which is likely to be damaged in the process of immersion in the DHF solution.

In order to avoid the above situation, and also remove parts of the residue 80 left in the alignment mark trench TR, as shown in FIG. 6, a nitrogen plasma step 83 is performed, the nitrogen plasma step 83 can implant nitrogen atoms into a partial region of the top surface of the second dielectric layer 32 to form a nitrogen-containing doped region 34, wherein the nitrogen-containing doped region 34 is in a nitrogen-rich region. According to the applicant's experimental results, the DHF solution (concentration ratio with water is about 500:1) has an etching rate ratio of about 0.1:10:1 for tungsten, silicon dioxide ($SiO_2$) and silicon oxynitride (SiON). That is, the DHF solution etches oxide at a much faster rate than tungsten or nitride. If nitrogen atoms are implanted on the surface of oxide (e.g., TEOS) by plasma doping, a protective layer, i.e., the nitrogen-containing doped region 34, can be formed on the surface region of second dielectric layer 32, which can effectively prevent damage to the surface of second dielectric layer 32 caused by immersion in DHF solution.

In addition, it should be noted that in the step of the present invention, during the nitrogen plasma step 83 is performed, or in the steps before and/or after the nitrogen plasma step 83 is performed, it is preferable to introduce only nitrogen, and without introducing other kinds of gases such as hydrogen or oxygen. In this way, it is possible to prevent other gases from mixing into the surface of the second dielectric layer 32 to reduce the nitrogen concentration of the nitrogen-containing doped region 34, thereby reducing the protection effect.

Next, as shown in FIG. 7, an etching step 94 is performed, for example, the semiconductor device is immersed in DHF solution to effectively remove part of the residue 80 left in the alignment mark trench TR. As described above, since the main component of residue 80 is silicon oxide, it can be effectively etched by DHF solution. It is worth noting that since the nitrogen-containing doped region 34 has been formed on the surface of the second dielectric layer 32 at this time, the surface damage of the second dielectric layer 32 caused by the DHF solution can be minimized in the process of immersing the semiconductor device in the DHF solution.

As shown in FIGS. 8-11, a patterned memory material layer 60P may be formed on the insulation layer 10. The patterned memory material layer 60P may include a first memory material pattern 60A and a second memory material pattern 60B separated from each other. The first memory material pattern 60A may be formed on the connection structure 40A, and the second memory material pattern 60B may be formed in the alignment mark trench TR. Additionally, in some embodiments, a second patterned conductive layer 50P and a patterned mask layer 70P may be formed on the insulation layer 10. The second patterned conductive layer 50P may include a bottom electrode 50A and a second pattern 50B. The bottom electrode 50A may be disposed between the connection structure 40A and the first memory material pattern 60A, and the second pattern 50B may be disposed in the alignment mark trench TR and disposed on the first pattern 40B. The patterned mask layer 70P may include a first mask pattern 70A and a second mask pattern 70B. The first mask pattern 70A may be disposed on the first memory material pattern 60A, and the second mask pattern 70B may be disposed in the alignment mark trench TR and disposed on the second memory material pattern 60B.

Specifically, the method of forming the second patterned conductive layer 50P, the patterned memory material layer 60P, and the patterned mask layer 70P may include but is not limited to the following steps. As shown in FIGS. 8-10, a second conductive layer 50, a memory material layer 60, and a mask layer 70 may be sequentially formed on the insulation layer 10 after the step of removing the residue 80. In some embodiments, the second conductive layer 50 may include metallic materials, such as tantalum, tantalum nitride, platinum (Pt), ruthenium (Ru), a stack layer of the above-mentioned materials, an alloy of the above-mentioned materials, or other suitable conductive materials. In some embodiments, the mask layer 70 may include insulation materials such as silicon nitride, silicon oxynitride, or other suitable insulation materials or conductive materials. In some embodiments, the memory material layer 60 may include a magnetic tunnel junction (MTJ) film stack layer, or other suitable memory element materials, such as a resistive memory element material, a phase change memory element material, or a ferroelectric memory element material. The MTJ film stack layer mentioned above may include a pinned layer, a first barrier layer, a free layer, a second barrier layer, and a conductive layer sequentially stacked with one another in the thickness direction Z of the insulation layer 10, but not limited thereto. The components of the MTJ film stack may be modified and/or include other material layers according to other design considerations. The pinned layer in the MTJ film stack layer may include a synthetic antiferromagnetic layer and a reference layer. The synthetic antiferromagnetic layer may include antiferromagnetic materials such as iron manganese (FeMn) or cobalt/platinum (Co/Pt) multilayer for a perpendicularly magnetized MTJ, but not limited thereto. The free layer in the MTJ film stack layer and the reference layer in the pinned layer may include ferromagnetic materials such as cobalt, iron (Fe), cobalt-iron (CoFe), cobalt-iron-boron (CoFeB), or other suitable ferromagnetic materials. The first barrier layer and the second barrier layer in the MTJ film stack layer may include insulation materials such as magnesium oxide (MgO), aluminum oxide, or other suitable insulation materials. The material of the conductive layer in the MTJ film stack layer may be similar to the material of the second conductive layer 50, but not limited thereto.

In some embodiments, the second conductive layer 50, the memory material layer 60, and the mask layer 70 may be formed by deposition processes, such as a physical vapor deposition (PVD) process and/or a chemical vapor deposition (CVD) process, but not limited thereto. In some embodiments, a planarization process 96 may be performed to the second conductive layer 50 before the step of forming the memory material layer 60 for lowering the surface roughness of the second conductive layer 50 and/or adjusting the thickness of the second conductive layer 50 on the memory cell region R1 (as shown in FIG. 9), but not limited thereto. The planarization process 96 may include a CMP process or other suitable planarization approaches.

As shown in FIG. 10 and FIG. 11, in some embodiments, a second patterned photoresist layer 82 may be formed on the mask layer 70, and an etching process using the second patterned photoresist layer 82 as a mask may be performed to etch the mask layer 70, the memory material layer 60, and the second conductive layer 50 for forming the patterned mask layer 70P, the patterned memory material layer 60P, and the second patterned conductive layer 50P described above. Therefore, the bottom electrode 50A may be separated from the second pattern 50B, the first memory material pattern 60A may be separated from the second memory material pattern 60B, and the first mask pattern 70A may be separated from the second mask pattern 70B. In addition, the material composition of the bottom electrode 50A may be identical to the material composition of the second pattern 50B, the material composition of the first memory material pattern 60A may be identical to the material composition of the second memory material pattern 60B, and the material composition of the first mask pattern 70A may be identical to the material composition of the second mask pattern 70B, but not limited thereto.

It is worth noting that, the materials formed in the alignment mark trench TR (such as the first pattern 40B, the second conductive layer 50, the memory material layer 60, and the mask layer 70) and/or the materials formed above the alignment mark trench TR (such as the second conductive layer 50, the memory material layer 60, and the mask layer 70) may be used as an alignment mark in an exposure process of forming the second patterned photoresist layer 82, and the alignment performance between the connection structure 40A and a memory structure MS including the bottom electrode 50A, the first memory material pattern 60A, and the first mask pattern 70A subsequently formed on the connection structure 40A may be improved because the alignment mark trench TR and the connection window H1 are formed by the same process.

In some embodiments, as shown in FIG. 11, a memory device 101 may include a memory structure MS composed of the bottom electrode 50A, the first memory material pattern 60A, and the first mask pattern 70A, and an alignment mark structure AM composed of the first pattern 40B, the second pattern 50B, the second memory material pattern 60B, and the second mask pattern 70B, but not limited thereto. In some embodiments, the patterned memory material layer 60P may include a MTJ film stack layer, and the memory device 101 may be regarded as a magnetic random access memory (MRAM) device, but not limited thereto.

In summary, one of the features of the present invention is that after the planarization step, some residues will be left in the alignment mark trench, which will affect the subsequent alignment step. Therefore, the present invention uses a nitrogen plasma step to form a nitrogen-containing doped region on the surface of the dielectric layer, and then uses diluted hydrofluoric acid to clean the residues while avoiding damaging the surface of the dielectric layer. According to the method provided by the invention, residues in the alignment mark trenches can be removed completely, the accuracy of subsequent alignment steps is improved, and the yield of memory elements is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a memory device, comprising:
   providing a dielectric layer;
   forming a contact window and an alignment mark trench in the dielectric layer simultaneously, wherein the contact window exposes a lower metal line;
   forming a conductive layer on the surface of the dielectric layer, in the contact window and in the alignment mark trench;
   performing a planarization step on the conductive layer and leaving a residue in the alignment mark trench;
   performing a nitrogen plasma step on the dielectric layer, wherein the residue is still remained in the alignment mark trench after the nitrogen plasma step is performed;
   performing a cleaning step to remove the residue in the alignment mark trench; and
   forming a patterned magnetic tunneling junction (MTJ) film on the contact window.

2. The method of claim 1, wherein the material of the residue comprises silicon oxide.

3. The method of claim 1, wherein the material of the conductive layer comprises tungsten.

4. The method of claim 1, wherein the conductive layer does not fill up the alignment mark trench.

5. The method of claim 4, wherein the residue is located on the conductive layer in the alignment mark trench.

6. The method according to claim 1, wherein the nitrogen plasma step does not include introducing oxygen and hydrogen.

7. The method according to claim 1, wherein before and after the nitrogen plasma step is performed, oxygen and hydrogen are not introduced.

8. The method according to claim 1, wherein after the conductive layer is filled in the contact window, the conductive layer and the contact window form a connection structure in the dielectric layer beside the alignment mark trench.

9. The method of claim 1, wherein after the nitrogen plasma step is performed, a top region in the dielectric layer is converted into a nitrogen-rich region.

10. The method of claim 1, wherein the cleaning step comprises cleaning with diluted hydrofluoric acid (DHF).

11. The method of claim 1, wherein the dielectric layer comprises tetraethoxysilane (TEOS).

12. The method of claim 1, wherein the residue comprises an abrasive in the slurry used in the planarization step.

* * * * *